United States Patent [19]
Kim

[11] Patent Number: 6,122,762
[45] Date of Patent: Sep. 19, 2000

[54] MEMORY INTERFACE DEVICE AND METHOD FOR SUPPORTING DEBUGGING

[75] Inventor: Ho-Ryong Kim, Seoul, Rep. of Korea

[73] Assignee: Samsung Electronics Co., LTD, Rep. of Korea

[21] Appl. No.: 09/153,598

[22] Filed: Sep. 15, 1998

[30] Foreign Application Priority Data

Sep. 25, 1997 [KR] Rep. of Korea .................. 97-48826

[51] Int. Cl.[7] ................................................ G01R 31/28
[52] U.S. Cl. ............................................................. 714/726
[58] Field of Search .................................. 714/727, 729, 714/730, 731, 726, 724, 718

[56] References Cited

U.S. PATENT DOCUMENTS

| | | | |
|---|---|---|---|
| 5,029,166 | 7/1991 | Jarwala et al. | 371/22.1 |
| 5,155,732 | 10/1992 | Jarwala et al. | 371/22.3 |
| 5,355,369 | 10/1994 | Greenbergerl et al. | 371/22.3 |
| 5,485,466 | 1/1996 | Lyon et al. | 714/726 |
| 5,590,354 | 12/1996 | Klapproth et al. | 714/727 |
| 5,636,227 | 6/1997 | Segars | 371/22.3 |

*Primary Examiner*—Hoa Nguyen
*Attorney, Agent, or Firm*—Samuels, Gauthier & Stevens LLP

[57] ABSTRACT

An integrated circuit memory interface device includes a debug controller for generating debug control signals in response to memory access control signals, and individual address and data boundary-scan registers. Each of the address and data boundary-scan registers has a predetermined number of cells which are daisy-chained from cell to cell. The address and data registers are placed between a memory device and a core logic which performs normal interface operations with respect to the devices during a normal mode. The interface device includes a test access port (TAP) controller which operates in synchronism with a test clock signal during test and debugging modes, and an instruction register. The TAP controller receives a test mode select signal and generates register control signals in response to the test clock and mode select signals. The instruction register receives a test/debug instruction via the serial boundary-scan test data input port and generates memory access control signals in response the test/debug instruction.

11 Claims, 7 Drawing Sheets

Fig. 1

(Prior Art)

Fig. 2

(Prior Art)

MEMORY INTERFACE DEVICE AND METHOD FOR SUPPORTING DEBUGGING

BACKGROUND OF THE INVENTION

A recent development in integrated circuit testing is the use of the JTAG (Joint Test Action Group) test port for in-situ testing of integrated circuit (IC) chips mounted on a board. This standard has been adopted by the Institute of Electrical and Electronics Engineers (IEEE) and is now defined as IEEE Standard 1149.1-1990. The IEEE Std 1149.1 is described in "The Test Access Port and Boundary-Scan Architecture" (IEEE Computer Society Press. 1990), incorporated herein by reference.

Figure 1:
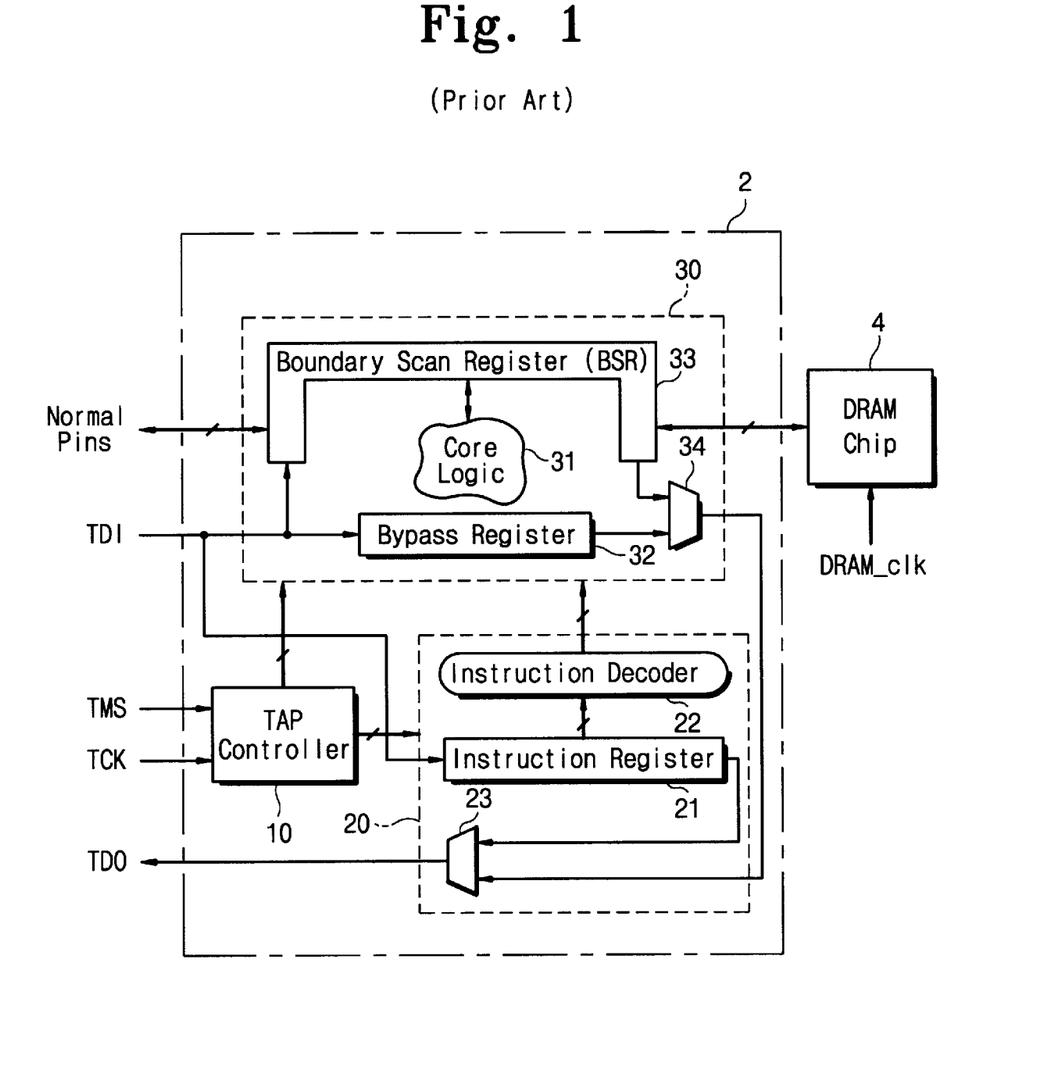
FIG. 1 is a schematic diagram showing a typical JTAG architecture based upon IEEE Std 1149.1.

FIG. 1 schematically shows a memory interface device with JTAG circuit (in accordance with IEEE Std 1149.1). Reference numerals 2 and 4 represent the memory interface chip with the JTAG circuit and a DRAM device chip, respectively. The JTAG circuit comprises three principal components: a Test Access Port (TAP) controller 10, an instruction register (IR) portion 20, and a boundary-scan register or data register (DR) portion 30. The instruction register portion 20 consists of an instruction register 21, an instruction decoder 22, and a multiplexer 23. The boundary-scan register portion 30 consists of a bypass register 32, a boundary-scan register 33 postioned at the perimeter of, or otherwise surrounding an application core logic 31 of, the interface device chip 2, and a multiplexer 34. As can be seen in FIG. 1, the JTAG circuit includes three inputs: a test clock (TCK), a test mode select (TMS), and a test data input (TDI); and one output, test data out (TDO).

Figure 2:
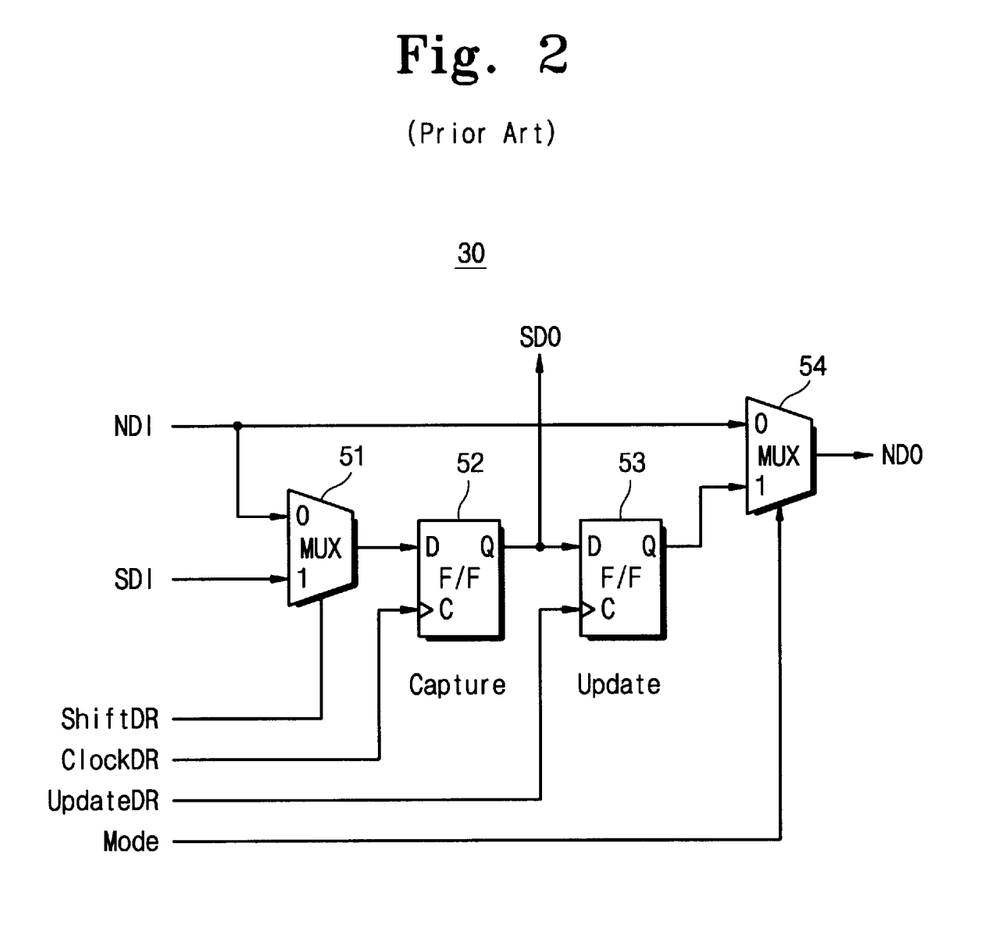
FIG. 2 is a circuit diagram showing a cell of the boundary-scan register of FIG. 1.

Implementation of JTAG boundary-scan testing requires that, in addition to its normal application logic, each integrated circuit chip be fabricated with circuits known as Boundary-Scan Cells shown in FIG. 2. A boundary-scan cell consists of two multiplexers 51, 54, and two flip-flops 52, 53, referred to respectively as "capture" and "update" flip-flops. Each boundary-scan cell includes two data inputs: a normal data input (NDI) and a serial data input (SDI); and two data outputs: a normal data output (NDO) and a serial data output (SDO). The boundary-scan cells are interconnected to form a scan path between the test data input TDI and test data output TDO of the application IC. Each boundary-scan cell is coupled between the application logic and one of the functional input and output pins of the integrated circuit such that each functional input and output pin is coupled to a separate one of a normal data input and normal data output respectively of the boundary-scan cell.

During normal IC operation, input and output signals pass freely through each boundary-scan cell, from the normal data input NDI, to the normal data output NDO. When the boundary-test mode is activated, the boundary of the integrated circuit is controlled in such a way that a test stimulus can be shifted in and applied to each boundary-scan cell input NDI, and a test response can be captured at each boundary-scan cell output NDP and shifted out for inspection.

Figure 3:
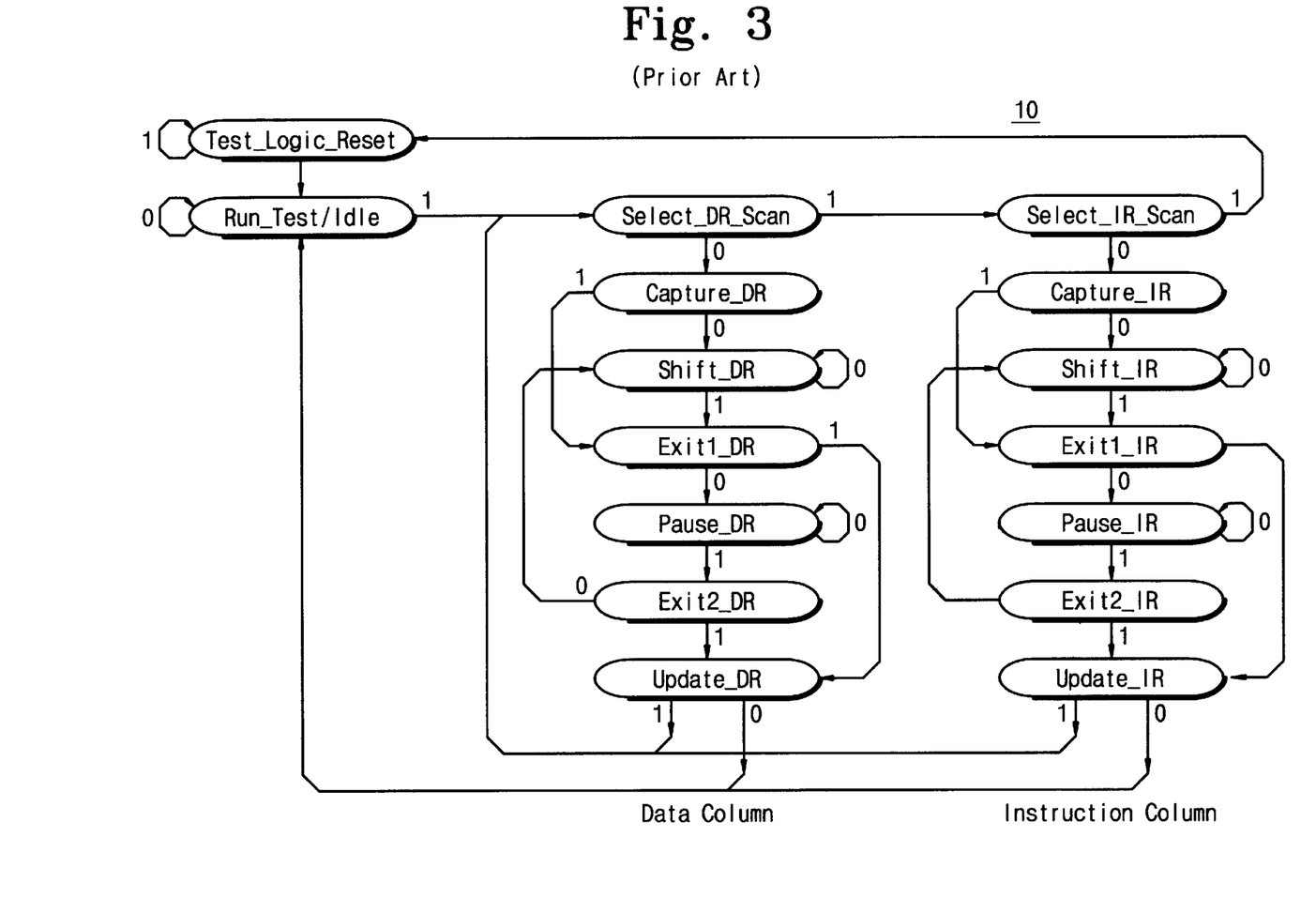
FIG. 3 is a state diagram of the TAP controller of FIG. 1.

FIG. 3 is a state diagram of the TAP controller 10 of FIG. 1. The TAP controller 10, driven by the TCK input, responds to the TMS input as shown. The state diagram consists of six steady states: Test_Logic_Reset, Run_Test/Idle, Shift_DR, Pause_DR, Shift_IR, and Pause_IR. A unique feature of this protocol is that only one steady state exists for the condition when TMS is set high: the Test_Logic_Reset state. This means that a reset of the test logic can be achieved within five TCK clock cycles or less by setting the TMS input high.

At power up, or during normal operation of the host IC, the TAP is forced into the Test_Logic_Reset state by driving TMS high and applying five or more TCK clock cycles. In this state, the TAP issues a reset signal that places all test logic in a condition that does not impede normal operation of the host IC. When test access is required, a protocol is applied via the TMS and TCK inputs, causing the TAP to exit the Test_Logic_Reset state and change to the appropriate state. From the Run_Test/Idle state, an instruction register scan or a data register scan can be issued to transition the TAP through the appropriate states shown in FIG. 3.

The states of the data register scan and instruction register scan columns are mirror images of each other, adding symmetry to the protocol sequences. This first action that occurs when either block is entered is a capture operation. For the data registers, the Capture_DR state is used to capture (or parallel load) the data into the selected serial data path. If the BSR is the selected data register, the normal data inputs (NDIs) are captured during this state. In the instruction register, the Capture_IR state is used to capture status information into the instruction register.

From the Capture state, the TAP transitions to either the Shift or Exit1. Normally, the Shift state follows the Capture state so that test data or status information can be shifted out for inspection and new data shifted in. Following the Shift state, the TAP either returns to the Run_Test/Idle state via the Exit1 and Update states or enters the Pause state via Exit1. The reason for entering the Pause state is to temporarily suspend the shifting of data through either the selected data register or instruction register while a required operation is performed, such as refilling a tester memory buffer. From the Pause state, shifting can resume by re-entering the Shift state via the Exit2 state or be terminated by entering the Run_Test/Idle state via the Exit2 state via the Exit2 and Update states.

Upon entering the data register scan or instruction register scan columns, the data being shifted into the selected scan path is not output until the TAP enters the Update_DR or Update_IR state. In the Update state, the new data being shifted into the selected scan path is updated.

Examples of contemporary boundary-scan testing techniques are disclosed in U.S. Pat. No. 5,029,166 for *Method And Apparatus For Testing Circuit Boards* issued to Jarwala et al., U.S. Pat. No. 5,155,732 for *Method And Apparatus For Data Transfer To And From Devices Through A Boundary-Scan Test Access Port* issued to Jarwala et al., U.S. Pat. No. 5,355,369 for *High-Speed Integrated Circuit Testing With JTAG* issued to Greenberger et al., and U.S. Pat. No. 5,636,227 for *Integrated Circuit Test Mechanism And Method* issued to Segars, the contents of all of which are incorporated herein by reference.

During a debugging operation, a program must be checked for errors or other types of malfunctioning. Program tracing is the most commonly used technique in program debugging, which is representative of the stream of instructions executed by a microprocessor. By examining the instruction stream that was executed, a programmer may determine if the application hardware and software are performing properly. If unintended behavior of the hardware or software is detected, the programmer may successively record all addresses in order to determine what caused the behavior. This recording can be done, either by monitoring the internal bus directly, or by temporarily logging such addresses for subsequent outputting and checking. Often, such procedures either consume a great deal of time in a step-by-step operation, or alternatively, require extensive external accessibility through a large amount of additional microprocessor pins. Both approaches are expensive. Moreover, it is difficult to organize execution of such monitoring in real time in view of the enormous amount of data produced.

SUMMARY OF THE INVENTION

The present invention is directed to to debugging techniques for integrated circuits, and more particularly to a memory interface device using a serial boundary-scan test access port for applying signals to and capturing signals from an integrated circuit.

It is an object of the present invention to provide an integrated circuit and method for interfacing a memory device with other devices by using a serial boundary-scan test access port in debugging mode, suitable for offering convenience in debugging.

It is another object of the present invention to provide a JTAG memory interface circuit with minimum hardware, and a method, for successfully accessing and debugging a dynamic random access memory device.

These and other objects, advantages and features of the present invention are provided by integrated circuit memory interface devices which include a debug controller for generating debug control signals (e.g. W_mode and Col_addr_updr) in response to memory access control signals (e.g. DRAM_debug, R_wbar, Col_addr_load, Bsr_mode), and individual address and data boundary-scan registers. Each of the address and data boundary-scan registers has a predetermined number of cells which are daisy-chained from cell to cell. The address and data registers are positioned between a memory device and a core logic which performs normal interface operations with respect to the devices during a normal mode.

In a preferred embodiment, the interface device further includes a test access port (TAP) controller which operates in synchronism with a test clock signal (TCK) during test and debugging modes, and an instruction register. The TAP controller receives a test mode select signal (TMS) and generates register control signals (e.g., Updateir, Shiftir, Updatedr, and Shiftdr) in response to the test clock and mode select signals. The instruction register receives a test/debug instruction via the serial boundary-scan test data input port and generates memory access control signals (e.g., DRAM_debug, R_wbar, Col_addr_load, and Bsr_mode) in response the test/debug instruction. The address boundary-scan register provides an address scan path between the memory device and the core logic in response to both the register control signals and the debug control signals. The data boundary-scan register provides a data scan path between the memory device and core logic in response to both the register control signals and the debug control signals.

In a preferred aspect of the present invention, the debug controller generates DRAM control signals in response to memory access control signals generated during debugging mode. In addition, the interface circuit further includes a multiplexer which is responsive to a predetermined one of the memory access control signals and selects either the DRAM control signals or another DRAM control signals provided from the core logic. The TAP controller generates first and second clock signals (Clockir and Clockdr). The instruction register is clocked with the first; and the address and data boundary-scan registers are clocked with the second. Specifically, the debug controller operates in synchronism with a DRAM clock signal (DRAM_clk) used to operate the DRAM device, and generates a third clock signal (e.g. Din_cap_clk) depending on CAS latency of the DRAM device. The data boundary-scan register captures data from the core logic in synchronism with the second clock signal (Clockdr) and data from the DRAM device in synchronism with the third clock signal (Din_cap_clk).

According to another preferred aspect of the present invention, a method for interfacing a dynamic random access memory (DRAM) device with other device by means of JTAG circuit is provided. It is first determined debug instruction is provided by the JTAG circuit during a refresh mode of the DRAM device. If so, the DRAM device is instructed to exit from the refresh mode and an address from the JTAG circuit is loaded into the DRAM device. Next, it is determined whether a read operation or a write operation of the DRAM device is provided. Depending on the operation mode, the DRAM device is accessed and precharged. Thereafter, the DRAM device is instructed to re-enter refresh mode and a debug end signal is provided to the JTAG circuit. During the read operation mode of the DRAM device, a clock signal (e.g. Din_cap_clk) is generated depending on CAS latency of the DRAM device, and data from the DRAM device are loaded into the JTAG circuit in synchronism with the clock signal.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 4:
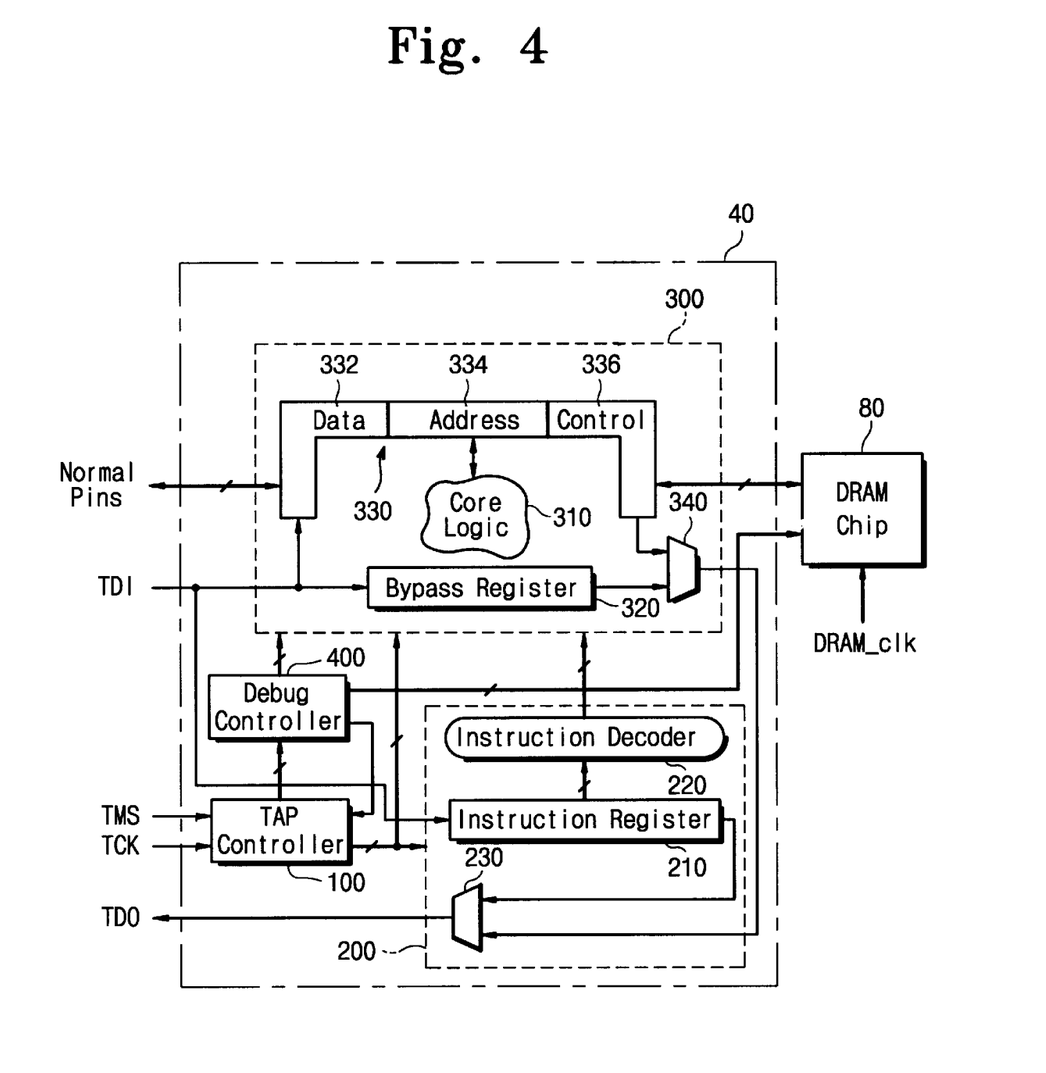
FIG. 4 is an embodiment of a JTAG debug architecture, adapted for supporting memory interface, according to the present invention.
Figure 5:
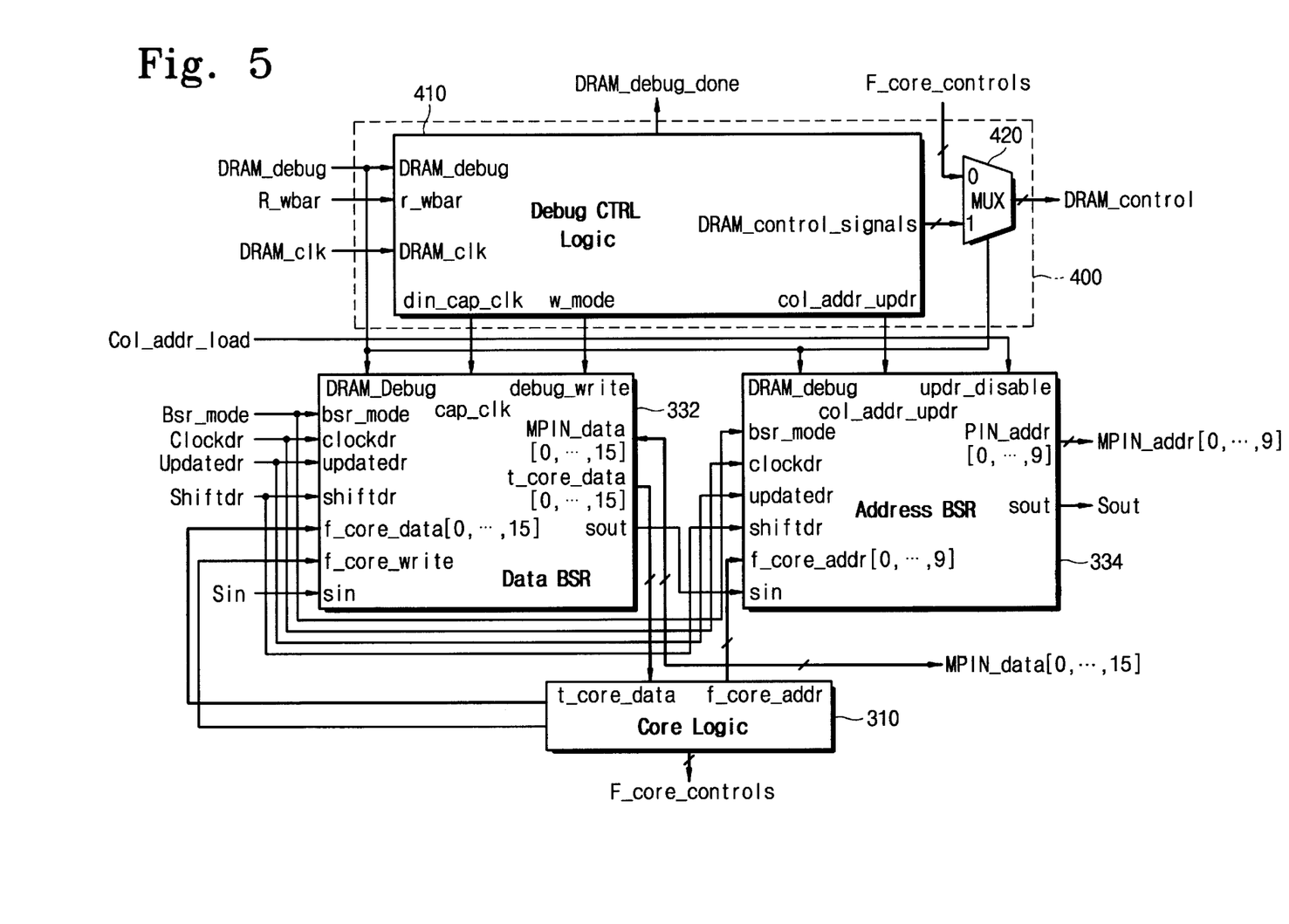
FIG. 5 is a block diagram showing an embodiment of the debug controller and the data and address boundary-scan registers of FIG. 4.

FIG. 4 shows a memory interface device 40 including a JTAG port based upon the IEEE Std 1149.1. The device supports debugging capabilities in accordance with an embodiment of the present invention. FIG. 5 is a block diagram showing an embodiment of the debug controller 400, the address boundary-scan register and the data boundary-scan register of FIG. 4.

Referring to FIGS. 4 and 5, reference numerals 40 and 80 represent a memory interface chip including a JTAG circuit, and a DRAM device chip, respectively. The JTAG circuit 40 is partitioned into four parts: a TAP (Test Access Port) controller 100, an instruction register (IR) part 200, a boundary-scan register (BSR) or data register (DR) part 300, and a debug controller 400. The instruction register part 200 consists of an instruction register 210, an instruction decoder 220, and a multiplexer 230. The boundary-scan register part 300 includes a bypass register 320, a boundary-scan register 330 surrounding an application core logic 310 of the interface device chip 40, and a multiplexer 340. The boundary-scan register 330 comprises three individual registers: data register 332, address register 334, and control register 336.

As can be seen in FIG. 4, the JTAG TAP circuit 100 includes three inputs: a test clock TCK, a test mode select TMS, and a test data in TDI. In addition, there is one output, a test data out TDO. The JTAG circuit may additionally include an optional input, a test reset TRSTN, although not shown.

TDI and TDO are daisy-chained from chip to chip, whereas TCK and TMS are broadcasted. The TCK input is independent of the system clocks for the chip so that test operations can be synchronized between different chips. The operation of the test logic is controlled by the sequence of signals applied at the TMS input. The TDI and TDO are serial data input and output, respectively, while the TRSTN signal is used to initialize a chip or circuit to a known state. JTAG testing may be used to test suitably configured integrated circuits to verify operability.

The TAP controller 100 operates synchronously with the test clock signal TCK during test and debugging modes and generates two clock signals Clockir and Clockdr. In addition, the TAP controller 100 receives the test mode select signal TMS and generates register control signals Updateir, Shiftir, Updatedr, and Shiftdr in response to the test clock signal TCK and the test mode select signal TMS.

The instruction register 210 is clocked with the clock signal Clockir provided from the TAP controller 100. The instruction register 210 receives a test/debug instruction via the serial boundary-scan test data input port TDI and generates memory access control signals DRAM_debug, R_wbar, Col_addr_load, and Bsr_mode, in response to the test/debug instruction.

The data, address and control boundary-scan registers 332, 334, 336 are clocked with the clock signal Clockdr. Each of the boundary-scan registers 332, 334, 336 has a predetermined number of cells which are daisy-chained from cell to cell. The registers 332, 334, 336 are placed between the memory device 80 and the core logic 310. The core logic 310 performs normal interface operations with respect to the devices on a board during a normal mode. The data boundary-scan register 332 captures data from the core logic 310 in synchronism with the clock signal Clockdr.

To save time when serially shifting data through registers, it is sometimes advantageous to skip certain ICs. The bypass register 320 is a single-bit register that is placed between the TDI and the TDO. When selected, the bypass register 320 provides a single-bit scan path between the TDI and the TDO. Thus, the bypass register 320 abbreviates the scan path through devices that are not involved in the test. The bypass register 320 is selected when the instruction register is loaded with a pattern of all ones to satisfy the IEEE Std 1149.1 BYPASS instruction requirement. When the BYPASS instruction is loaded in the instruction register 210 and the TAP is placed in a Shift_DR state, the bypass register 320 is placed between the TDI and the TDO. The advantage of the BYPASS instruction is that it shortens the boundary scan path when multiple devices are connected together on a board.

As shown in FIG. 5, the debug controller 400 consists of a debug control logic 410 and a multiplexer 420. The debug control logic 410 operates in synchronism with a DRAM clock signal DRAM_clk which is used to operate the DRAM device. The debug control logic 410 generates DRAM_control_signals (for example, output enable signal, chip select signal) and debug control signals W_mode and Col_addr_updr in response to the memory access control signals (DRAM_debug, R_wbar, Col_addr_load, and Bsr_mode) while in debugging mode. The multiplexer 420 is responsive to the signal DRAM-debug and selects either the DRAM control signals DRAM_controls or another DRAM control signal F_core_controls provided from the core logic 310 (see FIG. 4). The data boundary-scan register 332 provides a data scan path between the memory device 80 and the core logic 310 (see FIG. 4) in response to both the register control signals Updateir, Shiftir, Updatedr, and Shiftdr and the debug control signals W_mode and Col_addr_updr. The address boundary-scan register 334 provides an address scan path between the memory device 80 and the core logic 310 (see FIG. 4) in response to both the register control signals Updateir, Shiftir, Updatedr, and Shiftdr and the debug control signals W_mode and Col_addr_updr. In addition, the debug control logic 410 generates a clock signal Din_cap_clk depending on CAS latency of the DRAM device 80. The data boundary-scan register 332 captures data from the DRAM device 80 in synchronism with the clock signal Din_cap_clk. The control boundary-scan register 336 (see FIG. 4) is used for providing a control signal path between the DRAM device 80 and the core logic 310 during the test mode.

Figure 6:
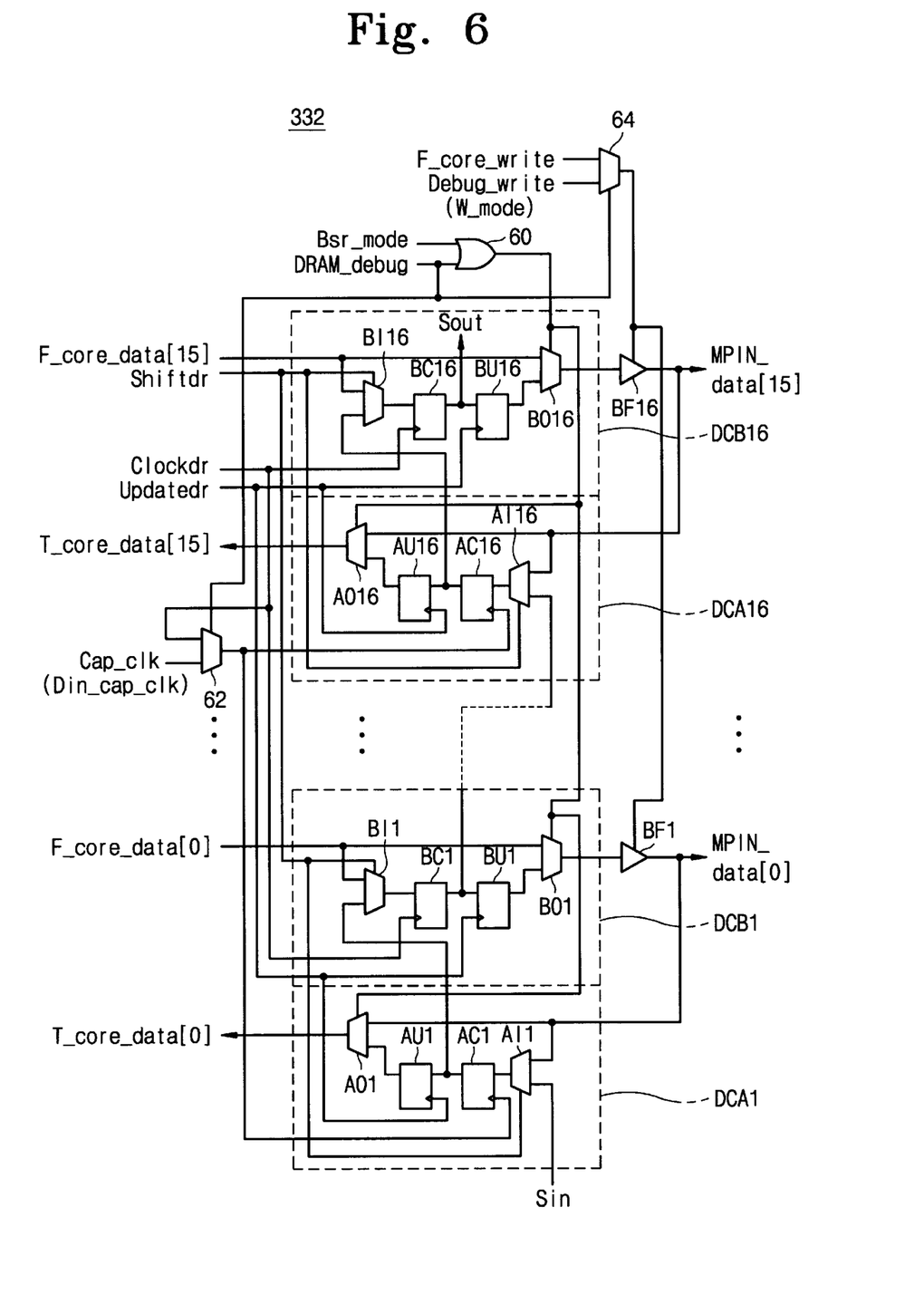
FIG. 6 is a detailed circuit diagram of the data boundary-scan register of FIG. 5.

FIG. 6 shows a detailed circuit construction of the data boundary-scan register 332 of FIG. 5. One side of the data boundary-scan register 332 is coupled to the bidirectional data bus pins MPIN_data [0]–[15] of the DRAM device 80 (assuming a 16-bit-wide data bus) and the other side thereof is coupled to the data bus pins F_core_data [0]–[15] and/or T_core_data [0]–[15] of the core logic 310. The data boundary-scan register 332 includes input cells DCA1–16 and output cells DCB1–16. Each cell is comprised of two input and output multiplexer AIi (or BIi) and AOi (or BOi), and two capture and update flip-flops ACi (or BCi) and AUi (or BUi), where i=1, 2, ... 16. The output of each capture flip-flop ACi is provided to the input multiplexer within the next boundary-scan cell as its serial output signal. The multiplexers BO1–16 are coupled with the DRAM data bus pins MPIN_data [0]–[15] via tri-state buffers BF1–16, respectively.

The capture flip-flop ACi of each input cell DCAi is clocked by either the clock signal Clockdr provided from the TAP controller 100 or the clock signal Din_cap_clk (or Cap_clk) provided from the debug control logic 410, and the update flip-flop AUi thereof is clocked with the control signal Updatedr from the instruction register 210. The capture flip-flop BCi of each output cell DCBi is clocked with the clock signal Clockdr from the TAP controller 100 and the update flip-flop BUi thereof is also clocked with the control signal Updatedr from the instruction register 210.

The DRAM debug enable signal DRAM_debug and the boundary-scan register enable signal Bsr_mode, which are generated by the instruction register 210, are fed to inputs of an OR logic gate 60. The signal Clockdr from the TAP controller 100 and the clock signal Din_cap_clk (or Cap_clk) from the debug control logic 410 are provided to a multiplexer 62. This multiplexer 62 is controlled by the DRAM debug enable signal DRAM_debug. The write control signal F_core_write from the core logic 310 and the debug write mode signal Debug_write (or W_mode) from the debug control logic 410 are provided to a multiplexer 64. This multiplexer 64 is also controlled by the DRAM debug enable signal DRAM_debug. Multiplexers AI1–AI16 and BI1–BI16 are controlled by the shift select signal Shiftdr provided from the TAP controller 100, while multiplexers AO1–16 and BO1–16 are controlled by the output of the OR logic gate 60. The tri-state buffers BF1–16 are controlled by the output of the multiplexer 64.

When the signal DRAM_debug becomes active and the signal Debug_write becomes inactive, a data signal output from the DRAM device 80 is loaded into a corresponding capture flip-flop ACi in synchronism with the clock signal Din_cap_clk (or Cap_clk) that is generated by the debug controller 400 on the basis of the CAS latency of the DRAM device 80. Thus, the DRAM data can be output externally via TDO pin (for example, to a host debug computer) in synchronism with the test clock signal TCK, allowing the DRAM data to be scanned out of the JTAG test circuitry. If the signal Updatedr becomes active, then the update flip-flop AUi is updated with the output of the capture flip-flop in synchronism with the clock signal Clockdr.

Figure 7:
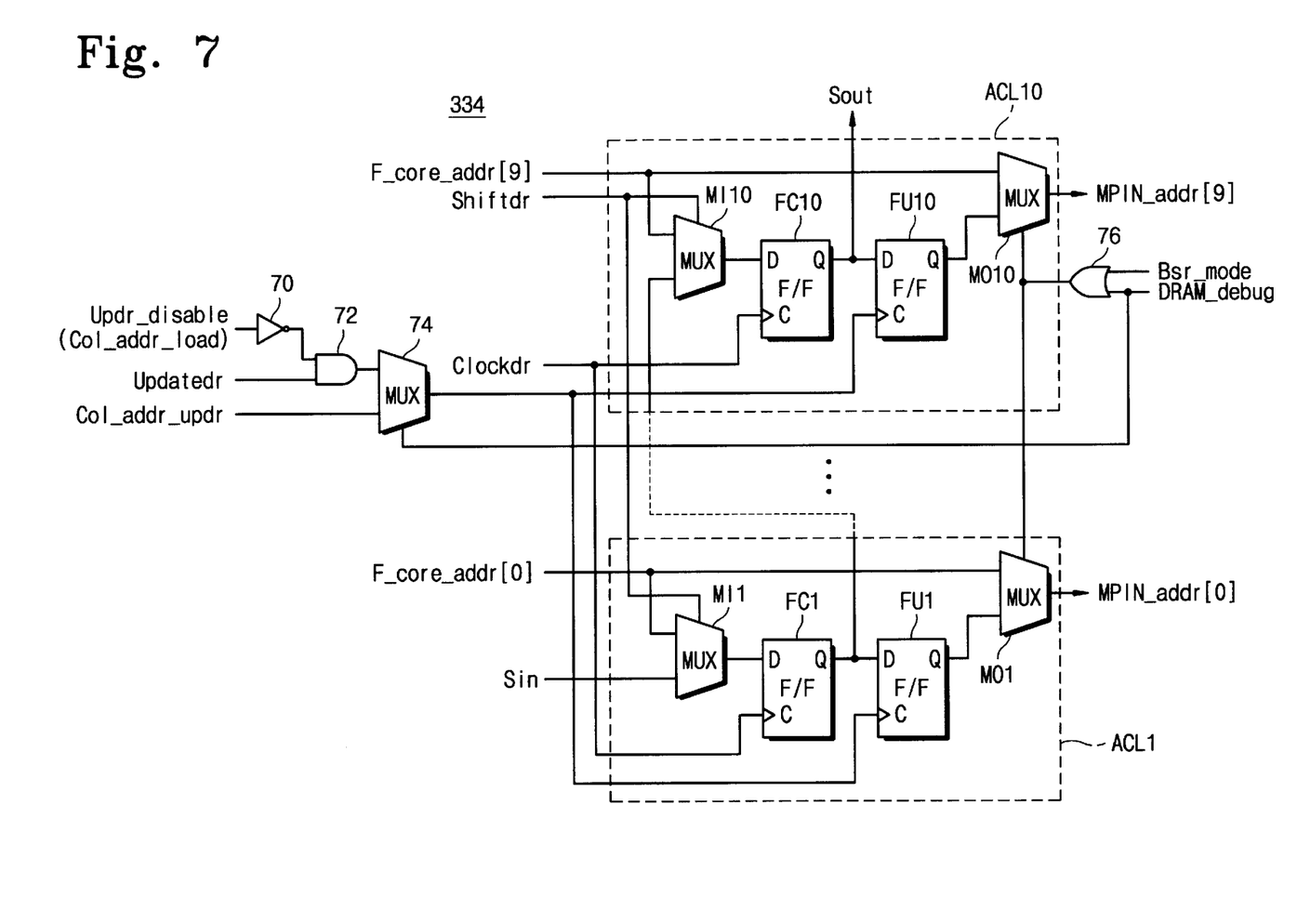
FIG. 7 is a detailed circuit diagram of the address boundary-scan register of FIG. 5.

FIG. 7 is a detailed circuit construction of the address boundary-scan register 334 of FIG. 5. One side of the address boundary-scan register 334 is coupled to the address bus pins MPIN_addr [0]–[9] (assuming a 10-bit-wide address bus) of the DRAM device 80, and the other side thereof is coupled to the data bus pins F_core_addr [0]–[9] of the core logic 310. The address boundary-scan register 334 includes 10 cells ACL1–10, each of which is comprised of two input and output multiplexer MIi and MOi, and two capture and update flip-flops FCi and FUi, where i=1, 2, . . . , 10. The output of each capture flip-flop FCi is provided to the input multiplexer MIi on the next boundary-scan cell as its serial output signal. All input multiplexers MI1–10 are controlled by the signal Shiftdr from the TAP controller 100.

The address boundary-scan register 334 further includes an inverter 70, an AND logic gate 72, a multiplexer 74, and an OR logic gate 76. The inverter 70 is fed with the signal Col_addr_load (or Updr_disable) provided from the instruction register 210. The AND logic gate 72 is supplied with output of the inverter 70 and the signal Updatedr form the TAP controller 100. The output of the AND logic gate 72 and the signal Col_addr_updr generated by the debug control logic 410 are presented to the multiplexer 74. The OR logic gate 76 is provided with the signals Bsr_mode and DRAM_debug from the instruction register 210. The multiplexer 74 and the output multiplexers MO1–10 are controlled by the output of the OR logic gate 76.

The capture flip-flop FCi of each boundary-scan cell ACLi is clocked with the clock signal Clockdr provided from the TAP controller 100, and the update flip-flop FUi thereof is clocked with the output of the multiplexer 74.

In typical DRAM devices, an address multiplexing method is commonly employed to reduce the chip size. In this technique, an identical address line is controlled by the row address strobe signal and the column address strobe signal. Accordingly, the same address lines are used to input both the row address and the column address for a single read/write operation. Such DRAM devices with multiplexed addressing are sequentially provided with a row address and a column address.

When the signal Updr_disable becomes inactive (logic low), a row address is loaded into the update register in synchronism with the signal Updatedr. If the signal Updr_disable becomes active (logic high), then a column address is loaded into the capture flop-flop FCi in synchronism with the clock signal Clockdr and the row address remains in the update flip-flop FUi. When DRAM access is initiated, the signal col_addr_updr becomes active so that the column address moves to the update flip-flop FUi.

The DRAM device can be accessed through a memory interface technique in accordance with the present invention as defined by the following steps:

1. Load Row Address

Load the boundary-scan register enable code into the instruction register

Load a row address into the address boundary-scan register

2. Load Column Address and DATA

Load the column address load code into the instruction register

Load a column address into the address boundary-scan register

3. Start DRAM Access

Load the DRAM read/write mode and DRAM debug enable codes into the instruction register 4. Monitor End of DRAM Access Check if the DRAM_debug_done is active 5. Read Data Load the boundary-scan register enable code into the instruction register when the debug end signal DRAM_debug_done is active Read test data from the JTAG circuit via its test data output port TDO As described above, the debug controller 400 generates DRAM control signals in synchronism with the DRAM clock signal DRAM_clk depending on the instruction set loaded in the instruction register 210. DRAM debugging starts from a refresh operation of the DRAM device 80. First, the debug controller 400 checks whether a debug instruction is given from the JTAG circuit during a refresh mode of the DRAM device 80. If so, the controller 400 forces DRAM device to exit from the refresh mode. The controller 400 controls the address boundary-scan register 334 to load row and column addresses from the JTAG circuit. The controller 400 checks if either a read operation or a write operation mode of the DRAM device is activated. Depending upon the operation mode, the controller 400 controls the DRAM device 80 to be accessed. At this time, if the signal R_wbar is active (logic high), the controller 400 generates the clock signal Din_cap_clk to load data into the data boundary-scan register 332, depending upon the CAS latency of the DRAM device 80. Thereafter, the controller 400 controls the DRAM device 80 to be precharged and to enter the refresh mode again. When the DRAM device 80 stays in the refresh mode, the controller 400 provides a debug end signal DRAM_debug_done to the JTAG circuit. A programmer or software engineer can read test data from the JTAG circuit via its test data output port TDO after the debug end signal DRAM_debug_done becomes active.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A debug circuit for monitoring the interface of a memory device and a core logic during a test mode, the core logic for performing a normal interface operations with respect to said memory device during a normal mode, the debug circuit having serial boundary-scan test data input and output ports, the debug circuit comprising:

a test access port controller operating in synchronism with a test clock signal during said test mode, for receiving a test mode select signal and generating register control signals in response thereto;

an instruction register for receiving a test instruction via said serial boundary-scan test data input port and for generating memory access control signals in response thereto;

a debug controller for receiving said memory access control signals and generating debug control signals in response thereto;

an address boundary-scan register coupled between said core logic and said memory device, for providing an address scan path therebetween in response to said register control signals and said debug control signals; and a data boundary-scan register coupled between said core logic and said memory device, for providing a data scan path therebetween in response to said register control signals and said debug control signals, said address and data boundary-scan registers each having a predetermined number of daisy-chained cells to form said address scan path and said data scan path.

2. The circuit of claim 1, wherein said memory device is a dynamic random access memory (DRAM) device.

3. The circuit of claim 2, wherein said debug controller, during said test mode, generates DRAM control signals in response to said memory access control signals.

4. The circuit of claim 3, further comprising a multiplexer which is responsive to a predetermined one of the memory access control signals and, in response thereto, selects either the DRAM control signals provided by the debug circuit or second DRAM control signals provided by said core logic.

5. The circuit of claim 2, wherein said test access port controller generates first and second clock signals, said instruction register operating in synchronism with the first clock signal, and said address and data boundary-scan registers operating in synchronism with the second clock signal.

6. The circuit of claim 5, wherein said debug controller operates in synchronism with a DRAM clock signal which is used to operate said DRAM device.

7. The circuit of claim 6, wherein said debug controller generates a third clock signal having a frequency which depends on the CAS latency of said DRAM device.

8. The circuit of claim 7, wherein said data boundary-scan register captures data from said core logic in synchronism with the second clock signal and data from said DRAM device in synchronism with the third clock signal.

9. A method for monitoring the interface of a memory device and a core logic during a test mode, the core logic for performing normal interface operations with respect to said memory device during a normal mode, comprising:

receiving a test mode select signal and generating register control signals in response thereto at a test access prot controller during said test mode;

receiving a test instruction via a serial boundary-scan test data input port and generating memory access control signals in response thereto, at an instruction register;

receiving memory access control signals and generating debug control signals in response thereto, at a debug controller;

providing an address scan path at an address boundary-scan register coupled between the logic and the memory device, in response to said register control signals and said debug control signals;

providing a data scan path at a data boundary-scan register coupled between the core logic and the memory device, in response to said register control signals and said debug control signals, the address and data boundary-scan registers each having a predetermined number of daisy-chained cells to form said address scan path and said data scan path.

10. A method for monitoring the interface of a dynamic random access memory (DRAM) device and a core logic by means of a JTAG (Joint Test Access Group) circuit, the method comprising:

determining whether a debug instruction is provided by the JTAG circuit during a refresh mode of the DRAM device;

in response to the debug instruction, instructing the DRAM device to exit from the refresh mode;

loading an address from the JTAG circuit into the DRAM device;

determining whether a read operation or a write operation mode of the DRAM device is to be performed;

accessing the DRAM device in accordance with the operation mode;

determining whether DRAM access has been completed; and instructing the JTAG circuit to perform a boundary-scan of the core logic such that DRAM test data is provided at the JTAG circuit output.

11. The method of claim 10, wherein said step of accessing the DRAM device comprises:

generating a clock signal, the frequency of which depends on the CAS latency of the DRAM device during the read operation mode; and loading data from the DRAM device into the JTAG circuit in synchronism with the clock signal.

* * * * *